Dec. 27, 1960 T. H. BONN ET AL 2,966,597

TRANSISTOR AMPLIFIER AND PULSE SHAPER

Filed July 28, 1955 2 Sheets-Sheet 1

INVENTORS
THEODORE H. BONN
JOHN PRESPER ECKERT, JR.
BY Charles C. English
AGENT

INVENTORS
THEODORE H. BONN
JOHN PRESPER ECKERT, JR.

BY William G. Miller Jr.
AGENT

United States Patent Office 2,966,597

Patented Dec. 27, 1960

2,966,597

TRANSISTOR AMPLIFIER AND PULSE SHAPER

Theodore H. Bonn and John Presper Eckert, Jr., Philadelphia, Pa., assignors to Sperry Rand Corporation, New York, N.Y., a corporation of Delaware Filed July 28, 1955, Ser. No. 524,843

6 Claims. (Cl. 307—88.5)

Figures 1, 1A, 1B, 2:
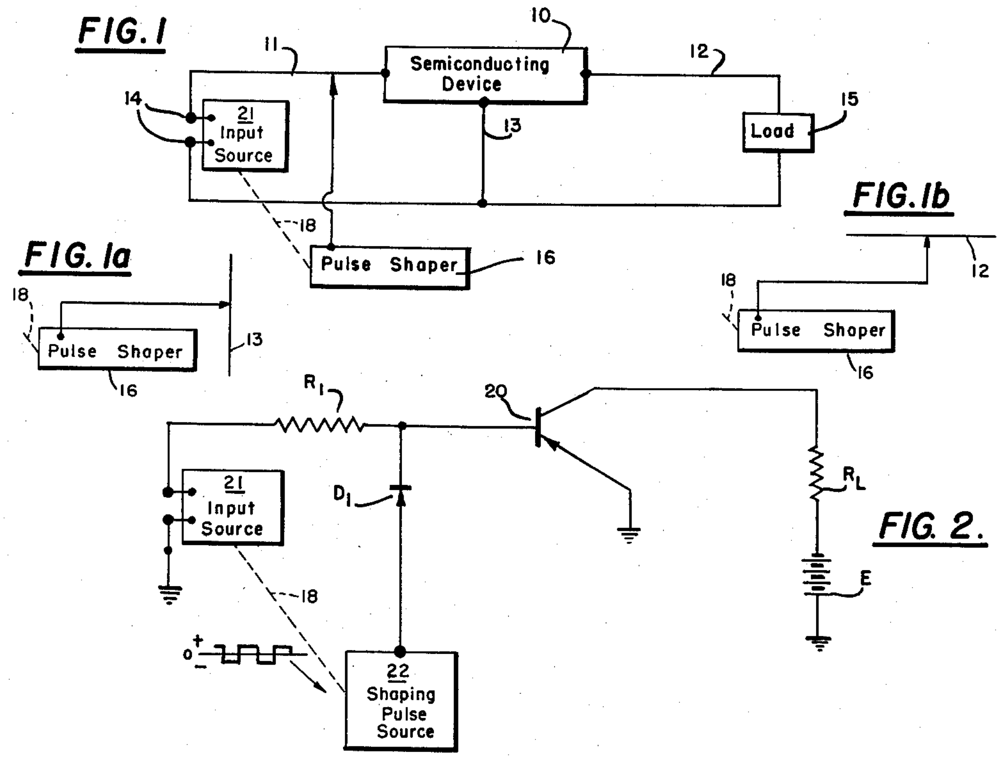

The present invention relates to amplifier structures and more particularly relates to such structures utilizing in their operation the charge carrier storage phenomenon or enhancement charge storage phenomenon normally present in semiconductor amplifiers. In this respect, the present invention utilizes such phenomena, heretofore considered an undesirable characteristic of semiconductor amplifiers, in the provision of simplified amplifier devices having improved operating characteristics.

Transistor circuits have, in the past, exhibited what may be termed a charge carrier storage or an enhancement charge phenomenon. In this respect, the term "transistor", used in the subsequent description and appended claims, is meant to denote any semiconductor device having three or more electrodes. It has been observed that in such devices, under normal operating conditions, the output current is a function of the input current applied thereto. In particular, however, it has been noted that if output current is established in such a transistor device and the input current should then suddenly be decreased, the output current will not immediately decrease, due to the presence of enhancement charge which continues to flow in the output mesh of the network. This continued flow of current, termed "enhancement current," subsequent to decrease or removal of an input signal, arises by reason of the storage of excess holes or electrons in the lattice of the solid state material comprising the amplifier whereupon a certain finite time is required for these excess holes or electrons to be "cleaned up" in the amplifier subsequent to removal of an input signal. In the past, this phenomenon has been considered a serious defect in transistor devices, and in circuits utilizing such devices.

The present invention makes direct use of this phenomenon for providing means timing the rise and fall of a current pulse in the output of a transistor circuit. In particular, the present invention utilizes such phenomena in the provision of pulse shape regeneration and pulse amplification in transistor circuits, and combines such pulse amplification and pulse shape regeneration in a single transistor stage with a minimum of components. Such results have previously been accomplished by the utilization of regenerative amplification or by the production of either internal or external instability in the transistor; but, in accordance with the present invention, this introduced instability or regeneration may be completely eliminated.

It is accordingly an object of the present invention to provide an improved semiconductor amplifier.

A further object of the present invention resides in the provision of a transistor amplifier whereby the timing of the rise and fall of an output current pulse may be readily and accurately controlled.

A still further object of the present invention resides in the provision of an improved transistor circuit wherein the provision of internal or external instability is made unnecessary, while at the same time obtaining the same results heretofore obtained by virtue of the said provision of such internal or external instability.

A further object of the present invention resides in the provision of a semiconductor amplifier having an inherent short time memory.

A still further object of the present invention resides in the provision of a semiconductor amplifier which is more simple in construction and which utilizes fewer components than has been the case heretofore.

Another object of the present invention resides in the provision of a transistor amplifier which makes effective use of the stored charge carrier or enhancement charge phenomenon previously considered an operational defect in such circuits.

A still further object of the present invention resides in the provision of a shaping circuit for use in transistor amplifiers whereby an output pulse of larger area, and having a faster rise and fall time, than an input pulse applied thereto may be effected.

A further object of the present invention resides in the provision of a shaping circuit for transistor amplifiers whereby the amplifier output may be eliminated at a predetermined time subsequent to cessation of an input signal.

A still further object of the present invention resides in the provision of a shaping circuit for use in transistor amplifiers whereby an input signal is ineffective for a predetermined time, subsequent to application thereof, in the production of an output signal from a transistor amplifier.

A still further object of the present invention resides in an amplifier circuit wherein pulse shape regeneration and pulse amplification may take place concurrently in a single transistor stage without the use of regenerative amplification.

The foregoing objects and advantages of the present invention are effected by the provision of a shaping circuit coupled to a transistor amplifier device. As will appear subsequently, the said shaping circuit may comprise a rectifier in combination with a source of variable potential, such as a source of clock pulses, for selectively rendering the said rectifier conductive; and the said rectifier may in turn be coupled to any of the electrodes of a transistor.

A source of input signals and load means are also coupled to the said transistor, and the arrangement is such that application of an input signal to the system tends to produce a flow of current in the transistor and through the load, in accordance with known theories of operation. In general, it is preferred that the input current should be of sufficient amplitude and time duration to produce output current saturation of the transistor and should in addition be of sufficient amplitude and time duration to store charge carriers within the lattice structure of the solid state material utilized, whereby the output current saturation of the transistor will be sustained for a certain time interval subsequent to cessation of the input signal. The shaping circuits, comprising the aforementioned rectifier, may then be rendered operative at a predetermined time interval subsequent to cessation of the input signal, and while enhancement current is flowing through the load, to draw the enhancement charge out of the semiconductor material rapidly whereby the load current rapidly falls at the said predetermined time interval subsequent to cessation of the input signal. The device may also be so arranged that the shaping circuit is operative during an initial time period when an input signal is applied to the transistor thereby to render the said input signal ineffective in producing an output current, whereby the rise of the output pulse may be timed, and also shaped to have a faster rise time than the input pulse applied to the transistor.

As will appear in the subsequent description, the present invention contemplates also a combination of these modes of operation wherein the shaping circuit initially renders an input pulse ineffective to produce an output; thereafter permits such an output; and finally operates to draw enhancement charge out of the transistor whereby the fall time and wave shape of the output or load current may be readily and accurately controlled.

The foregoing objects, advantages, construction and operation will become more readily apparent from the following description and accompanying drawings, in which:

Figure 1 is a block diagram generically representative of an improved transistor amplifier constructed in accordance with the present invention.

Figure 1*a* is a partial diagram showing an alternate connection of the pulse shaper of Figure 1.

Figure 1*b* is a partial diagram showing another alternate connection of the pulse shaper of Figure 1.

Figure 2 is a schematic diagram of a transistor amplifier arranged in accordance with one form of the present invention.

Figure 2A:
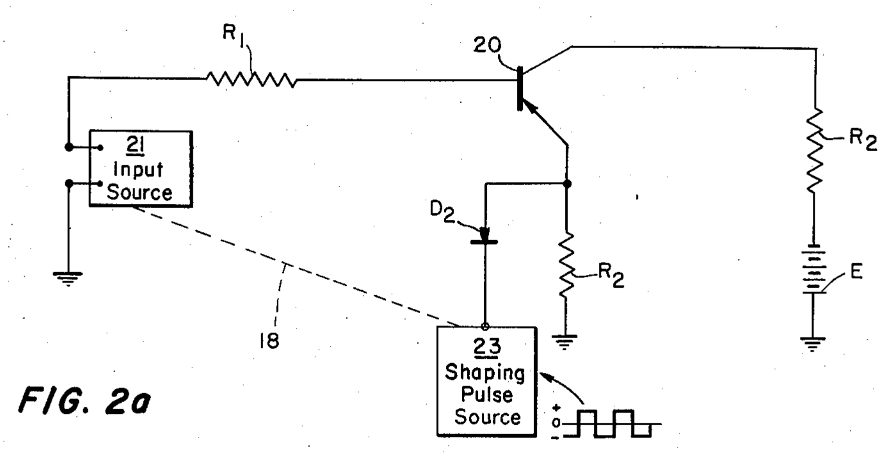

Figure 2*a* is a schematic diagram showing another form of the invention.

Figure 2B:
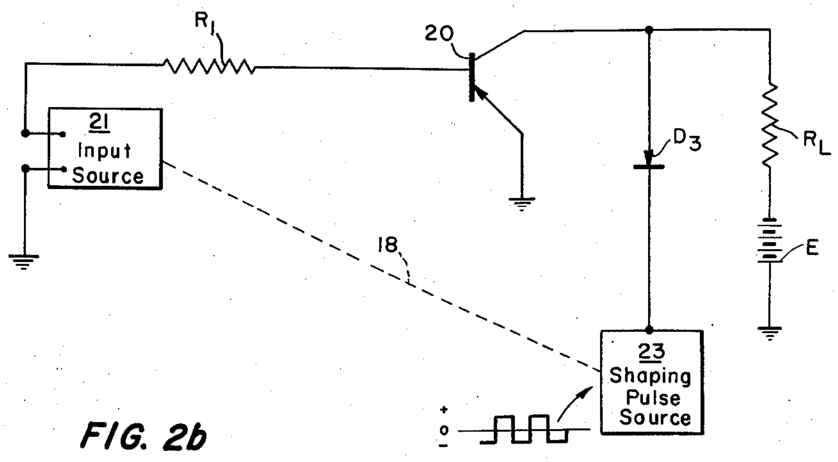

Figure 2*b* is a schematic diagram showing still another form of the invention.

Figure 3:
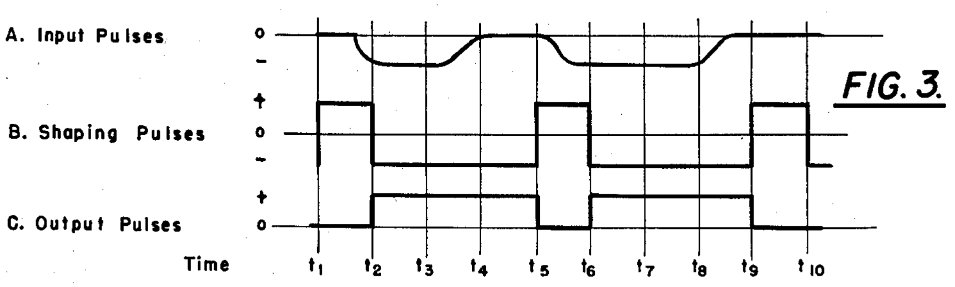
Figure 4:
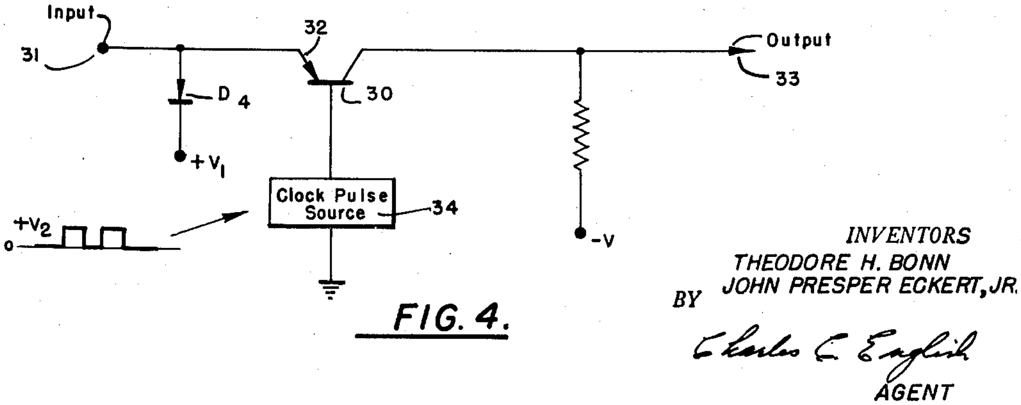

Figure 3 (A through C) are waveform diagrams illustrative of the operation of the circuit shown in Figure 2; and Figure 4 is a schematic diagram of a transistor amplifier arranged in accordance with a modified form of the present invention.

Referring now to the circuit of Figure 1, it will be seen that a general three-terminal semiconductor amplifier may comprise a semiconducting device 10, such as a transistor, having an input electrode 11, an output electrode 12, and a common electrode 13. A source of selectively applied input signals from an input source 21 may be coupled to terminals 14 of the system between the input and common electrodes 11 and 13, and a load 15 may be coupled to the output of the system between electrodes 12 and 13. The arrangement of Figure 1 is intended to be such that any of the three transistor terminals, namely, the collector, base or emitter, may be connected as any of the three electrodes 11, 12 and 13, whereby the interconnection of semiconducting device 10, input means 14 and load 15, as shown in Figure 1, is meant to generically illustrate six possible dispositions of the said input and load means with respect to the three electrodes of the transistor.

In providing for the aforedescribed operation of the present invention, a pulse shaper 16 may be coupled to either the input electrode 11, as shown in Figure 1; to the output electrode 12, as shown in Figure 1*b* or to the common electrode 13, as shown in Figure 1*a*; it being understood that these three connections are alternatives in the connection of the pulse shaper 16 to the remainder of the circuit. Thus, due to these three possible connections of the pulse shaper 16, and to the six possible interconnections of the transistor 10 with the input 14 and load 15, Figures 1, 1*a* and 1*b* generically illustrate eighteen possible interconnections of transistor amplifier and pulse shaper. A timing means 18, which may take one of a number of forms, provides a coupling between the input source 21 and the pulse shaper 16 and is operative to cause the shaping pulses to have a certain time relationship with the signals from input source 21. This timing relationship is desirably as set forth subsequently in connection with the description of Figures 2 and 3.

As has been mentioned previously, output current passing in the mesh 12—15—13, is normally a function of input current applied to terminals 14, but because of the charge carrier storage or enhancement charge phenomenon mentioned previously, if the input current applied to terminals 14 should suddenly be decreased, the output current will not immediately decrease but will continue as an enhancement charge current flowing in the output mesh of the network. The fact that an output current is sustained in the output mesh of the circuit after an input pulse applied to terminal 14 has disappeared, makes it possible to use a shaping device such as 16 to eliminate the output at a predetermined time, thus giving a means of obtaining a pulse of larger area than the input pulse and having a faster fall time than the input pulse. This continued flow of enhancement charge current, subsequent to cessation of an input pulse, also causes the device to exhibit a predetermined delay or memory, up to the limitations imposed by the amount of stored enhancement charge.

The pulse shaper 16 may also be employed to prevent an output current from flowing into the load 15 until a given predetermined time, regardless of the presence of an input pulse at terminals 14, whereby the rise of the output pulse may be timed and also shaped to have a faster rise time than the input pulse. The above described technique thus combines pulse amplification and pulse shape regeneration in a single transistor stage with a minimum of components, this result having previously been accomplished only by the use of regenerative amplification or by the introduction of instability in the circuit. The device, as described, may thus be employed in a variety of applications, and finds particular value in digital computer logic.

The pulse shaper 16 may take a number of different forms, but in a preferred embodiment of the present invention, comprises a rectifier having one terminal thereof coupled to an appropriate electrode of the semiconducting device 10 and having the other electrode thereof coupled to a source of variable potential for rendering the said rectifier selectively conductive. The said source of variable potential may comprise means generating clock pulses, and these clock pulses may in turn be A.C. coupled to the circuit, if this is found advantageous for realizing the desired operating condition. At any period when an output pulse is desired, the clock signal should assume a level such that said output pulse is not inhibited. Similarly, at any period when an output pulse may appear but is undesirable, the clock signal should assume a level such that the output pulse is inhibited. In particular, after an output current has been flowing, or may have been flowing, in the circuit and shortly before or at the time when it is desired that such output current should cease to flow, the clock signal should assume a potential level such that the residual enhancement charge is drawn out of the semiconductor material, thereby to cause the output current to fall rapidly. The rectifier and clock pulse source may be coupled to the input electrode of the transistor and the said rectifier may be rendered selectively conductive thereby to bypass an input signal from the transistor; or may be rendered selectively nonconductive to permit the passage of such an input signal to the transistor. Similarly, the rectifier comprising the wave shaper of the present invention may be coupled to the output of the transistor and may be rendered selectively conductive or non-conductive to bypass output current or to permit the flow of load current, respectively. As will appear subsequently, the wave shaper may also be coupled to the common electrode between the input and output of the system to accomplish the same purposes. In any of these cases, however, the rectifier and clock pulses should be so arranged that when it is desired that an output current cease, the rectifier serves to drain residual enhancement charge from the transistor and away from the load.

The foregoing operation will be more readily appreciated from an examination of Figures 2, 2*a* and 2*b* and the waveforms of Figure 3, which depict alternative arrangements for one possible form of transistor amplifier, arranged in accordance with the present invention, and utilizing a common emitter circuit. The transistor 20 may have the base thereof coupled via an impedance R1 to a source of input signals 21 having the shape shown in Figure 3A and the collector of the said transistor 20 may be coupled via a load $R_L$, and a potential source E, to ground. Impedance R1 may in fact comprise the impedance of signal source 21. The emitter of the transistor 20 may also be coupled, as shown, to ground. The arrangements of the circuits shown in Figures 2, 2*a* and 2*b* thus comprise the special case of a PNP device in a common emitter circuit, and when such a PNP device is employed, the input signal should be negative-going to turn the transistor "on." A source of clock pulses 22 (Figure 2) or 23 (Figure 2*a* or 2*b*) may be coupled, as shown, to any one of the collector, emitter or base electrodes. In accordance with one form of the present invention as shown in Figure 2, the clock pulse source 22 may be coupled via a rectifier D1 to the base of transistor 20, but in accordance with possible alternatives of the invention as shown in Figures 2*a* and 2*b*, the clock pulse source 23 may be coupled via a rectifier D2 or via a rectifier D3 to the emitter or collector of the transistor, respectively.

If, as shown in Figure 2*a*, the source of clock pulses 23 should be coupled to the common terminal of the transistor, for instance via the rectifier D2, this source of clock pulses may be applied to such common terminal across an external impedance, such as R2. The said external impedance may, in certain circumstances, introduce circuit instability and/or loss of gain and may therefore be found undesired in some applications. One method of eliminating this factor when it is desired to couple the clock pulse source to the common terminal, is to connect the said clock pulse source in series with the said common terminal between the common transistor terminal and ground. In this latter case, the clock pulses should assume a potential level of substantially zero when an output signal is desired, and the said clock pulses should assume a negative potential level when an output signal is to be inhibited.

Inasmuch as there is ordinarily power amplification between the input and output terminals of the transistor 20, it is usually desirable to apply the clock signal to the input of the circuit as shown in Figure 2, for instance via the rectifier D1, thereby to reduce the power required of the said clock signal. It will be appreciated that, in accordance with the foregoing discussion, however, any one of the coupling arrangements shown in Figure 2, 2*a* or 2*b* comprising respectively rectifiers D1, D2 and D3, may be employed. The waveforms of Figure 3 depict the polarity and timing sequence of an assumed sequence of signals for the configuration of Figure 2, wherein clock pulses 22 are applied to the base of transistor 20 via the rectifier D1. The timing of the clock pulses from the shaping pulse source 22 in relation to the signals from the input source 21 is determined by the timing means 18 which may be any of a number of different means capable of establishing the timed relationship between the shaping pulses and the input signal as illustrated in Figure 3.

Examining the waveforms of Figure 3, it will be seen that the shaping pulses (Figure 3B) may be alternately positive and negative-going in polarity and these alternations in polarity are as arbitrarily shown in the figure. If it should be assumed that the shaping pulses are positive in polarity during a time interval *t1* to *t2*, the rectifier D1 will be connected, and if a negative-going input signal should be coupled to the circuit during the time interval *t1* to *t2* and prior to time *t2*, (Figure 3A), the conduction of rectifier D1 will render the portion of the input signal preceding time *t2* ineffective in producing an output. If now, at time *t2*, the clock pulse 22 should fall to a negative potential, rectifier D1 will disconnect, whereby the applied input pulse will drive transistor 20 and effect an output current through the load $R_L$ having the shape shown in Figure 3C. The input current pulse should preferably have sufficient amplitude to produce collector current saturation and to store sufficient charge carrier in the transistor 20 whereby the collector current saturation will be sustained for a certain time interval subsequent to cessation of the input pulse. This sustained collector current saturation has previously been designated enhancement current. If, therefore, the input pulse should fall substantially to zero at a time *t4* for instance, load current will continue to flow, for instance during a time interval *t4* to *t5* (Figure 3C), and this continued flow is not inhibited by the clock pulses 22 inasmuch as they are still negative-going in polarity during this time interval *t4* to *t5*. If, at a time *t5*, however, the clock pulses 22 should go positive in potential, once more rectifier D1 will connect thereby rapidly draining the enhancement charge from the semiconductor material and causing the output to fall rapidly to zero (Figure 3C).

A further sequence of operation analogous to the foregoing has been shown for the time interval *t5* to *t9*, and in this further sequence the input pulse applied to terminals 21 has been assumed to be of somewhat greater width than that applied in the time interval *t1* to *t4*. It will be appreciated, of course, that the enhancement charge current flowing subsequent to cessation of the input signal will tend to decay after a finite time. To assure a best functioning of the clock pulses in the shaping of the output current, therefore, these clock pulses should be so timed that the wave shaper is rendered operative prior to substantial decay of the enhancement charge current. So long as this requirement is observed, however, the technique thus described, which makes use of the charge carrier storage in a semiconductor to sustain an output pulse, permits the turning off of the said output pulse at a predetermined time, and in addition, permits ready and accurate control of the turning on of the amplifier circuit. The device thus effects, in a simple and inexpensive manner, the several advantages and objects given previously and thus provides an improved amplifier circuit finding ready utility in many applications such as computer logic.

While the particular circuits shown in Figures 2, 2*a* and 2*b* and described in reference to Figure 3 employ a grounded emitter connection, it will be appreciated from the generalized discussion given in reference to Figure 1 that other forms of transistor connection may be employed. Figure 4 specifically illustrates one such possible modification wherein the transistor employs a grounded base connection.

Thus, referring to the said Figure 4, it will be seen that a transistor 30 may have input pulses applied to a terminal 31 and thence to the emitter 32 of the said transistor and outputs may be taken selectively at a point 33 from the transistor collector. Shaping and enhancement clearing pulses may be provided by a clock pulse source 34 connected, as shown, between the transistor base and ground, and the said clock pulse source may exhibit regularly occurring positive-going excursions from a base level of substantially zero to a positive potential level of $+V_2$. The circuit of Figure 4 operates in a manner analogous to that described in reference to Figure 2 and the clock pulse source 34 exhibits its zero potential level at those times when an output signal is desired and assumes its positive potential level when the output signal is to be inhibited. If desired, the input or emitter of the circuit may include a positive clamp comprising a rectifier D4 coupled, as shown, to a source of potential $+V_1$, but the use of such a clamp is in fact optional.

If desired, the circuit of Figure 4 could be further modified by having the transistor collector clamped to a negative potential through a diode, and this latter clamp could be released when a signal is desired, and could be applied at the end of the output period thereby to accomplish the effects of retiming and hole clean-up simultaneously, in the manner already described in reference to Figures 1, 2, 2*a* and 2*b*.

While we have described preferred embodiments of the present invention, many variations therein will be readily suggested to those skilled in the art. The several possible interconnections of semiconducting device with the input and load, as well as the possible variations in interconnection of the pulse shaper and semiconducting device, have already been mentioned. Also, while the circuits described apply selective shaping pulses to a single transistor electrode, such pulses may be applied simultaneously to a plurality of transistor electrodes, and in certain applications this has distinct operational advantages. In addition, the pulse shaper itself may take numerous forms, functioning in accordance with the preceding principles. It must also be stressed that the term "transistor," while utilized above in connection with three-terminal semiconductor devices, is meant to generically include semiconducting devices having three or more terminals, as well as both point contact and junction transistors of either the PNP or NPN varieties. The so-called transistor tetrode, wherein a fourth terminal is employed as a control element regulating the operation of the transistor, may also be utilized in the above described arrangements. Similarly, multiple-emitter transistors are known wherein additional emitters are supplied to supplement the usual emitter, often on a time sharing basis. Again, such multiple-emitter transistors may be employed in amplifiers of the type contemplated herein.

The foregoing description is, therefore, meant to be illustrative only and is not limitative of our invention, and all such variations as are in accord with the principles discussed are meant to fall within the scope of the appended claims.

Having thus described our invention, we claim:

1. A non-regenerative amplifier system for reshaping and retiming signal pulses which are selectively produced by an input source between the beginning and end of successive time periods, which reach a certain amplitude within a predetermined time period after said beginning, and which substantially terminate before the end of said periods, said system comprising, in combination with said signal pulse source, a transistor having a first, second and third electrode and characterized by the production of enhancement current flow, means connecting said source to apply said signal pulses between a common connection and said first electrode, circuit means connecting said second electrode to said common connection, load means, a bias potential source, means connecting said load means and said bias potential source in series between said third electrode and said common connection, the signal pulses produced by said source being of such direction and magnitude as to tend to render said transistor conducting to pass output current from said bias potential source through said load, said transistor being operative to pass enhancement current for a certain time beyond the termination of said signal pulse to continue said output current, a pulse shaping circuit including a diode and a shaping pulse source for producing one of a series of regularly recurring shaping pulses for each of said time periods, said diode and said shaping pulse source being connected in series circuit between one of said electrodes and said common connection, said diode being poled to be forward biased by shaping pulses of said shaping pulse source, and timing means coupled to both said input source and said shaping pulse source and operative to cause the shaping pulses to be so timed with respect to the signal pulses from said input source that each shaping pulse begins at a time during one of said recurring time periods after the substantial termination of the corresponding signal pulse and before the decay of the enhancement current supplied by said transistor to said load and ends after the beginning of the next subsequent time period and after said time period for said signal pulses to reach said certain amplitude, whereby output signals are terminated by the beginning portion of said shaping pulse drawing off said enhancement current, and succeeding output signals cannot be produced until the ending portion of said shaping pulse.

2. A non-regenerative amplifier as called for in claim 1 wherein the first electrode of the transistor is the base electrode, the second electrode is the emitter electrode and the third electrode is the collector electrode.

3. A non-regenerative amplifier as called for in claim 1 wherein said shaping pulse source produces pulses which go to a positive potential from a negative potential with said positive potential forward biasing said diode and said negative potential back-biasing said diode.

4. A non-regenerative amplifier as called for in claim 1 wherein the diode and the shaping pulse source are connected in series between the base electrode and the common connection.

5. A non-regenerative amplifier as called for in claim 1 wherein the diode and the shaping pulse source are connected in series between the emitter electrode and the common connection.

6. A non-regenerative amplifier as called for in claim 1 wherein the diode and the shaping pulse source are connected in series between the collector electrode and the common connection.

References Cited in the file of this patent

UNITED STATES PATENTS

| | | |
|---|---|---|
| 2,627,039 | MacWilliams | Jan. 27, 1953 |
| 2,629,834 | Trent | Feb. 24, 1953 |
| 2,644,897 | Lo | July 7, 1953 |
| 2,670,445 | Felker | Feb. 23, 1954 |
| 2,698,392 | Herman | Dec. 28, 1954 |
| 2,748,269 | Slutz | May 29, 1956 |

OTHER REFERENCES

Proceedings I.E.E. (British), September 1954 (vol. 101, part III, No. 73), pp. 298–303, "The Transistor Regenerative Amplifier as a Computer Element," Chaplin.